United States Patent [19]

Doellein et al.

[11] Patent Number: 5,175,020
[45] Date of Patent: Dec. 29, 1992

[54] PROCESS FOR DEPOSITING A LAYER CONTAINING BORON AND NITROGEN

[75] Inventors: Guenther Doellein; Guenter Weidenbach, both of Hanover; Hans Meyer, Wunstorf; Udo Bringmann, Halstenbek; Andreas Weber; Claus-Peter Klages, both of Hamburg, all of Fed. Rep. of Germany

[73] Assignee: Solvay Deutschland GmbH, Hanover, Fed. Rep. of Germany

[21] Appl. No.: 873,194

[22] Filed: Apr. 24, 1992

[30] Foreign Application Priority Data

Apr. 26, 1991 [DE] Fed. Rep. of Germany ....... 4113791

[51] Int. Cl.⁵ ............................................. B05D 3/06
[52] U.S. Cl. .................................. 427/569; 427/249;
427/250; 427/255; 427/255.2; 427/294;
427/295; 427/585; 427/586; 427/575; 427/571
[58] Field of Search ....................... 427/38, 45.1, 53.1,
427/55, 249, 250, 255, 253.2, 294, 295

[56] References Cited

U.S. PATENT DOCUMENTS

| | | | |
|---|---|---|---|
| 3,321,337 | 5/1967 | Patterson | 148/6.3 |
| 4,440,108 | 4/1984 | Little et al. | 118/719 |
| 4,545,968 | 10/1985 | Hirano et al. | 423/290 |
| 4,971,779 | 11/1990 | Paine, Jr. et al. | 423/290 |

FOREIGN PATENT DOCUMENTS

| | | |
|---|---|---|
| 387988 | 4/1989 | Austria . |
| 216932 | 4/1987 | European Pat. Off. . |
| 297348 | 1/1989 | European Pat. Off. . |
| 450125 | 10/1991 | European Pat. Off. . |
| 1156071 | 5/1964 | Fed. Rep. of Germany . |
| 57-120664 | 7/1982 | Japan . |
| 2-274898 | 11/1990 | Japan . |

OTHER PUBLICATIONS

Patent Abstracts of Japan, vol. 10, No. 350, p. C-387, abstract of Hoshino, Japanese Published Application No. JP 61-149477, "Formation of Boron Nitride Film".
Patent Abstracts of Japan, vol. 10, No. 350, p. C-387, abstract of Hoshino, Japanese Published Application No. JP 61-149478, "Production of Boron Nitride Film of Hexagonal or Cubic Crystal".
Patent Abstracts of Japan, vol. 10, p. 99c388, abstract of Yagi, Japanese Published Application No. JP 61-153279, "Production of Material Coated with Hard Boron Nitride".
Patent Abstracts of Japan, vol. 10, No. 383, p. C-393, abstract of Yagi, Japanese Published Application No. JP 61-174378, "Production of Rigid Material Coated with Boron Nitride".
Patent Abstracts of Japan, vol. 11, No. 132, p. C-417, abstract of Yagi, Japanese Published Application No. JP 61-266576, "Production of Member Coated with High-Hardness Boron Nitride".
Bonham et al., "Trimethylamine-Borane, (Dimethylamino) Borane, and N,N',N''-Trimethylborazine", *Inorganic Synthesis*, pp. 8–12.
Shanfield et al., "Ion Beam Synthesis of Cubic Boron Nitride", *J. Vac. Sci. Tech.*, vol. 1, No. 2, pp. 323–325 (1983).
Schmolla et al., "Amorphous BN Films Produced in a Double-Plasma Reactor for Semiconductor Apls.", *Solid-State Electronics*, vol. 26, No. 10, pp. 931–939 (1983).
Halverson, "Effects of Charge Neutralization on Ion-Beam-Deposited Boron Nitride Films", *J. Vac. Sci. Tech.*, vol. 3, No. 6, pp. 2141–2146 (1985).
Lynch et al., "Transmition-Metal-Promoted Reactions of Boron-Hydrides, Syntheses Perlimerizations . . . ", *J. Am. Chem. Soc.*, vol. 111, pp. 6201–6209 (1989).
Kouvetakis et al., "Composition and Structure of Boron Nitride Films Deposited by Chemical Vapor Deposition from Borazine", *J. Vac. Sci. Tech.*, vol. 8, No. 6, pp. 3929–3933 (1990).

*Primary Examiner*—Bernard Pianalto
*Attorney, Agent, or Firm*—Foley & Lardner

[57] ABSTRACT

A process for depositing a layer containing boron and nitrogen on a substrate by decomposing one or more N-substituted borazoles in the presence of the substrate, in particular by a plasma CVD process.

21 Claims, No Drawings

PROCESS FOR DEPOSITING A LAYER CONTAINING BORON AND NITROGEN

BACKGROUND OF THE INVENTION

The present invention relates to a process for depositing a layer containing boron (B) and nitrogen (N) on a substrate.

It is known to use surface coatings to protect substrates against external influences, for instance oxidation or mechanical stress. Furthermore, it is already known to decompose diborane or a boron halide in the presence of ammonia in order to deposit layers containing boron and nitrogen. However, diborane and boron halides are dangerous substances which are difficult to handle.

SUMMARY OF THE INVENTION

It is the object of the present invention to provide a process for depositing a layer containing boron (B) and nitrogen (N) which does not have the disadvantages of the known processes.

This and other objects are achieved by providing a process for depositing a layer containing boron (B) and nitrogen (N) on a substrate, comprising depositing a layer containing B and N by decomposing in the presence of said substrate a compound corresponding to the formula (I), (II) or (III)

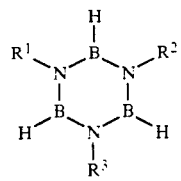
(I)

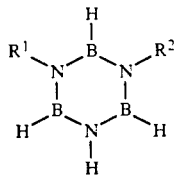
(II)

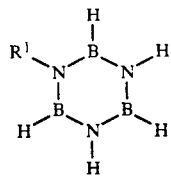
(III)

wherein $R^1$, $R^2$ and $R^3$ may be identical or different and represent:
- linear or branched alkyl with 1 to 12 carbon atoms;
- linear or branched alkyl, substituted by one or more substituents selected from the group consisting of halogen, lower alkoxy, di-lower alkylamine, and the adduct thereof with $BH_3$;
- linear or branched alkyl, substituted by one or more aryl radicals, in particular phenyl;
- linear or branched alkyl, substituted by one or more aryl radicals, which themselves are substituted by one or more substituents selected from the group consisting of halogen, lower alkyl, and halogenated lower alkyl;
- cycloalkyl, cycloalkenyl or cycloalkadienyl with a C4 to C7 carbon ring;
- cycloalkyl, cycloalkenyl or cycloalkadienyl with a C4 to C7 carbon ring, substituted by lower alkyl;
- aryl, in particular phenyl, toluyl, aryl with one or more condensed rings, in particular naphthyl;
- aryl, in particular phenyl, substituted by one or more substituents selected from the group consisting of halogen, lower alkyl; lower alkyl substituted by halogen; lower alkoxy; di-lower alkylamine; phenyl; cycloalkyl with C4 to C7 carbon ring;
- alkenyl with 2 to 4 carbon atoms;
- tri-lower alkyl silyl; or
- halogen, preferably fluorine.

DETAILED DESCRIPTION OF PREFERRED EMBODIMENTS

The process according to the invention for depositing a layer containing boron (B) and nitrogen (N) on a substrate is characterized in that a layer containing B and N is deposited by decomposing a compound of the general formula (I), (II) or (III)

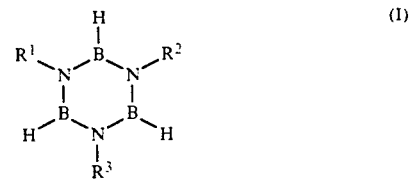
(I)

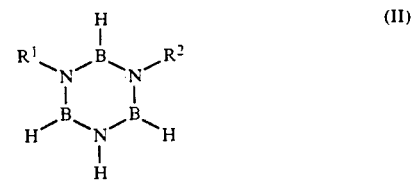
(II)

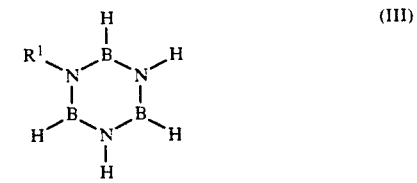
(III)

wherein $R^1$, $R^2$ and $R^3$ may be identical or different and represent:
- linear or branched alkyl with 1 to 12 C atoms;
- linear or branched alkyl, substituted by one or more substituents selected from the group consisting of halogen, lower alkoxy, di-lower alkylamine, and the adduct thereof with $BH_3$;
- linear or branched alkyl, substituted by one or more aryl radicals, in particular phenyl;
- linear or branched alkyl, substituted by one or more aryl radicals, which themselves are substituted by one or more substituents selected from the group consisting of halogen, lower alkyl, and halogenated lower alkyl;
- cycloalkyl, cycloalkenyl or cycloalkadienyl with a C4 to C7 carbon ring;
- cycloalkyl, cycloalkenyl or cycloalkadienyl with a C4 to C7 carbon ring, substituted by lower alkyl;
- aryl, in particular phenyl, toluyl, aryl with one or more condensed rings, in particular naphthyl;
- aryl, in particular phenyl, substituted by one or more substituents selected from the group consisting of halogen, lower alkyl; lower alkyl substituted by halogen; lower alkoxy; di-lower alkylamine; phenyl; cycloalkyl with C4 to C7 carbon ring; alkenyl with 2 to 4 C atoms;
tri-lower alkyl silyl; and
halogen, preferably fluorine.

As used herein the term "lower alkyl" refers to C1 to C3 alkyl.

$R^1$, $R^2$ and $R^3$ may, for example, each individually represent a methyl, ethyl, n-propyl, i-propyl, n-butyl, isobutyl, sec-butyl, t-butyl, $CH_2—CF_3$, $CH_2—CH_2Cl$, $CH_2—CCl_3$, $CH_2—CH_2Br$, $CH_2—CH=CH_2$, $(CH_2)_3—Cl$, $(CH_2)_3—OCH_3$, $(CH_2)_3—N(CH_3)_2$, $(CH_2)_3—N(CH_3)_2.BH_3$, phenyl, $C_6F_5$, 2-chlorophenyl, 3-chlorophenyl, 4-chlorophenyl, 3-bromophenyl, 4-bromophenyl, 2-methylphenyl, 3-methylphenyl, 4-methylphenyl, 2-trifluoromethylphenyl, 4-methoxyphenyl, 2-ethylphenyl, 4-ethylphenyl, 4-dimethylaminophenyl, 2-phenylphenyl, 4-cyclohexylphenyl, 2-chloro-6-fluorophenyl, 3,5-dichlorophenyl, 2,6-dichlorophenyl, 2-chloro-5-trifluoromethylphenyl, 3,5-di(trifluoromethyl)phenyl, 2-methyl-4-cyclohexylphenyl, 3,4,6-trichlorophenyl, benzyl, pentafluorophenylmethyl, 2-chlorophenylmethyl, cyclohexyl, n-dodecyl, diphenylmethyl, 1-naphthyl, trimethylsilyl, or fluoro group.

Halogen free compounds are preferred.

In compounds of the general formula (II), $R^1$ or $R^2$ is preferably methyl, ethyl, n-propyl, i-propyl, i-butyl, sec-butyl or $CH_2—(CF_2)_2—CF_3$. Compounds in which $R^1$ and $R^2$ are identical, i.e. for instance N,N'-dimethylborazole; N,N'-diethylborazole; N,N'-di-n-propylborazole; N,N'-diisopropylborazole; N,N'-di-isobutylborazole; N,N'-di-sec-butylborazole and N,N'-di-(n-trifluoropropylmethyl)borazole, are highly suitable. However, compounds in which $R^1$ and $R^2$ are not identical may also be used.

Preferably N-methylborazole, N-ethylborazole, N-n-propylborazole, N-isopropylborazole, N-isobutylborazole, N-sec-butylborazole or N-t-butylborazole are used as compounds of the general formula (III).

In the process of the present invention, a compound of the general formula (I) is preferably used. In the compound of general formula (I) which is used, the substituents $R^1$, $R^2$ and $R^3$ may be identical or different.

For instance, the following N,N',N"-substituted borazoles may be used: $(methyl)_3B_3N_3$, $(ethyl)_3B_3N_3$, $(n-propyl)_3B_3N_3$, $(isopropyl)_3B_3N_3$, $(n-butyl)_3B_3N_3$, $(isobutyl)_3B_3N_3$, $(sec-butyl)_3B_3N_3$, $(t-butyl)_3B_3N_3$, $(CH_2—CF_3)_3B_3N_3$, $(CH_2—CH_2Cl)_3B_3N_3$, $(CH_2—CCl_3)_3B_3N_3$, $(CH_2—CH_2Br)_3B_3N_3$, $(CH_2—CH=CH_2)_3B_3N_3$, $((CH_2)_3—Cl)_3B_3N_3$, $((CH_2)_3—OCH_3)_3B_3N_3$, $((CH_2)_3—N(CH_3)_2.BH_3)_3B_3N_3$, $((CH_2)_3—N(CH_3(_2)_3B_3N_3$, $(phenyl)_3B_3N_3$, $(C_6F_5)_3B_3N_3$, (2-chlorophenyl)$_3B_3N_3$, (3-chlorophenyl)$_3B_3N_3$, (4-chlorophenyl)$_3B_3N_3$, (3-bromophenyl)$_3B_3N_3$, (4-bromophenyl)$_3B_3N_3$, (2-methylphenyl)$_3B_3N_3$, (3-methylphenyl)$_3B_3N_3$, (4-methylphenyl)$_3B_3N_3$, (2-trifluoromethylphenyl)$_3B_3N_3$, (4-methoxyphenyl)$_3B_3N_3$, (2-ethylphenyl)$_3B_3N_3$, (4-ethylphenyl)$_3B_3N_3$, (4-dimethylaminophenyl)$_3B_3N_3$, (2-phenylphenyl)$_3B_3N_3$, (4-cyclohexylphenyl)$_3B_3N_3$, (2-chloro-6-fluorophenyl)$_3B_3N_3$, (3,5-dichlorophenyl)$_3B_3N_3$, (2,6-dichlorophenyl)$_3B_3N_3$, (2-chloro-5-trifluoromethylphenyl)$_3B_3N_3$, (3,5-di(trifluoromethyl)phenyl)$_3B_3N_3$, (2-methyl-4-cyclohexylphenyl)$_3B_3N_3$, (3,4,6-trichlorophenyl)$_3B_3N_3$, (benzyl)$_3B_3N_3$, (pentafluorophenylmethyl)$_3B_3N_3$, (2-chlorobenzyl)$_3B_3N_3$, (cyclohexyl)$_3B_3N_3$, (n-dodecyl)$_3B_3N_3$, (diphenylmethyl)$_3B_3N_3$, (1-naphthyl)$_3B_3N_3$, (trimethylsilyl)$_3B_3N_3$, (fluoro)$_3B_3N_3$.

Borazoles in which $R^1$, $R^2$ and $R^3$ differ from each other may also be used.

It is particularly preferred to use a compound of formula (I) in which $R^1$, $R^2$ and/or $R^3$ may be identical or different and represent linear or branched alkyl with 1 to 12 carbon atoms, particularly preferably linear or branched alkyl with 1 to 5 carbon atoms, especially methyl, ethyl, n-propyl, isopropyl, n-butyl, isobutyl or t-butyl.

Among the compounds in which $R^1$, $R^2$ and $R^3$ do not all have the same meaning, those compounds in which $R^1$ and $R^2$ have the same meaning and $R^3$ has a different meaning are particularly suitable. The substituent pairings of some representative compounds of this type are listed in the following table:

| $R^1$ and $R^2$ | $R^3$ |
| --- | --- |
| methyl | ethyl |
| methyl | isopropyl |
| ethyl | isopropyl |
| methyl | t-butyl |
| isopropyl | t-butyl |
| methyl | cyclohexyl |
| ethyl | cyclohexyl |
| ethyl | methyl |
| isopropyl | methyl |
| t-butyl | ethyl |
| t-butyl | methyl |
| t-butyl | isopropyl |
| cyclohexyl | methyl |
| hydrogen | fluoro |
| fluoro | hydrogen |

It will be apparent to those skilled in the art that this table discloses specific compounds. For example, the entries in the first row represent N,N'-dimethyl-N"-ethylborazole.

It is especially preferred to use compounds of formula (I) in which in which $R^1$, $R^2$ and $R^3$ are identical. The following compounds of general formula (I) are outstandingly suitable: N,N',N"-trimethylborazole, N,N',N"-triethylborazole,N,N', N"-tri-n-propylborazole,N,N',N"-trisopropylborazole, N,N',N"-tri-n-butylborazole,N,N',N"-triisoutylborazole, and N,N',N"-tri-t-butylborazole. N,N',N"-trimethylborazole and N,N',N"-triethylborazole are particularly preferred.

The preparation of compounds of the general formula (I), (II) or (III) is known, for instance from Bonham et al., *Inoro. Synth.*, Vol. 9, pages 8–12 (1967) and also from German Patent No. DE 1,156,071.

To prepare borazoles from amines which exist in gaseous form under normal conditions, sodium borohydride and a corresponding alkyl ammonium chloride are reacted in a high-boiling solvent. Methyl ammonium chloride, for instance, reacts according to the following equation:

$$3NaBH_4 + 3CH_3—NH_3Cl \rightarrow (CH_3—N—B—H)_3 + 3NaCl + 9H_2 \qquad (1)$$

This method of preparation has the advantage that a solid nitrogen compound can be used.

The reaction of sodium borohydride and boron trifluoride etherate in an ether, for instance tetrahydrofuran, according to the following general reaction equation:

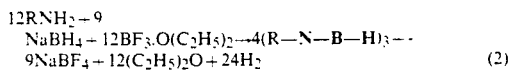

(2)

is also suitable for synthesizing borazoles from liquid amines.

The synthesized borazoles are then purified by distillation or sublimation.

To prepare borazoles in which $R^1$, $R^2$ and $R^3$ are not identical or in which $R^2$ and/or $R^3$ are/is hydrogen, for instance diborane, $NH_3$ and a primary amine may be reacted together at high temperature (for methylamine, for instance, 200° C.) for about 15 to 30 minutes. The three borazoles which form are separated by fractional condensation.

The deposition of the layer containing B and N preferably takes place from the gas phase. The use of the term "gas phase" is not intended to rule out the possibility that liquid droplets may optionally likewise be present in the gas atmosphere. In other words, the term "gas phase" also includes the term "vapor phase".

However, deposition may also take place from the condensed phase.

It will be apparent to a person skilled in the art that the invention is not limited to using just one particular compound of the general formula (I), (II) or (III). Mixtures of such compounds may also be used, for instance mixtures of two or more compounds of the general formula (I), mixtures of two or more compounds of the general formula (I) and (II), etc. Accordingly, references made hereinafter to the use of "a compound", should also be considered applicable to mixtures of compounds.

To effect deposition from the condensed phase, the borazole starting compound, either without solvent or dissolved in a solvent, is applied to the substrate and decomposed. Suitable solvents include, for example, polar or non-polar, aprotic organic solvents.

Known methods may be used to apply the respective starting compound to the substrate. For instance, the substrate may be dipped into the compound or a corresponding solution of the compound, the starting compound or a corresponding solution may be painted onto the substrate, or preferably, the compound or a corresponding solution may be sprayed onto the substrate. This embodiment makes it possible to coat even large surfaces very rapidly.

Then the starting compound applied to the substrate is decomposed in order to deposit a layer containing B and N. This may take place under reduced pressure, if desired. Advantageously the compound is decomposed thermally. This may be effected by introducing the substrate to which the starting compound has been applied into an appropriately heated chamber, or by heating the substrate to a sufficiently high temperature before, during and/or after the application of the starting compound.

Thermal decomposition may also be radiation-induced, for instance by a laser which operates in the UV range, in the infrared range, or in the visible light range.

Alternatively, the compound may, if desired, be decomposed by photolysis. Photolytic decomposition may be induced by a laser operated at the appropriate wavelength or by a UV lamp.

The decomposition may also be plasma-induced. This may be achieved in accordance with any of the known plasma methods, for instance by a low-pressure plasma, e.g. D.C. or A.C. plasma or by a glow discharge plasma, and furthermore by a thermal plasma. Suitable plasma reactors which can be used are known to persons skilled in the art.

The form in which the layers containing B and N are deposited can be influenced by adding further gases. This, and also the possibility of simultaneous or successive deposition of other metals, will be described hereinafter.

The other embodiment relates to the decomposition of the starting compound in the gas phase. This embodiment is preferred, and permits deposition of particularly well adhering, uniform, thin, and optionally transparent layers.

In particular in this embodiment, compounds, preferably compounds of the general formula (I), are used which can be converted into the gas phase at a temperature of at most 150° C. and at normal, or preferably reduced, pressure. For example, compounds in which $R^1$, $R^2$ and/or $R^3$ are methyl, ethyl, n-propyl, isopropyl, n-butyl, isobutyl, sec-butyl, t-butyl, 1,1,1-trifluoroethyl, chloroethyl or bromoethyl have these properties.

Naturally, compounds which are also liquid at a temperature of at most 150° C., particularly compounds of formula (I), are especially suitable. For example, compounds in which $R^1$, $R^2$ and/or $R^3$ represent methyl or ethyl are liquid at a temperature of at most 150° C. and can be converted into the gas phase at this maximum temperature and at normal pressure or reduced pressure.

The pressure in the gas phase may be high or low and will also depend on the nature of the decomposition process which is used. For instance, it is possible to operate at a pressure which corresponds to the vapor pressure of the starting compound which is used at the operating temperature. However, the total pressure may also be higher, up to normal pressure. Furthermore, however, it is also possible to operate at a pressure which is lower than the vapor pressure of the starting compound used.

The starting compound may be decomposed in the gas phase, for example, in the manner of a CVD (Chemical-Vapor-Deposition) process without a plasma additionally being used. In such a case, the pressure may be between normal pressure and about $10^{-3}$ Torr. Decomposition is advantageously effected under reduced pressure, for example at $10^{-2}$ to 50 Torr, preferably at 0.1 to 30 Torr.

The principle of the method of coating substrates using such a CVD process and also suitable apparatus for this purpose are known, for instance, from European Patent Application No. EP 297,348.

Decomposition from the gas phase is advantageously carried out in a pressure-tight apparatus which can be evacuated. First the substrate which is to be coated is introduced into this apparatus, and then the pressure in the apparatus is reduced. An atmosphere is then produced which contains the starting compound. If desired, other gases besides the gaseous starting compound may be present in the gas space of the apparatus, as will be explained hereinafter.

In one variant of the invention, the starting compound is introduced into the apparatus together with the substrate which is to be coated.

In an alternative, preferred variant, initially only the substrate is introduced into the pressure-tight apparatus, and the starting compound, which is already in gaseous form, is introduced into the apparatus continuously or discontinuously via a special line. If desired, additional gases may be used as carrier gas for the starting compound or alternatively may be introduced into the apparatus separately from the starting compound.

Decomposition is effected in accordance with known methods, thermally, by plasma-induction or photolytically.

Thermal decomposition from the gas phase without using a plasma is usually carried out in such a way that the walls of the apparatus are kept cold and the substrate is heated to a temperature at which the desired layer containing B and N is deposited on the substrate. The minimum temperature required for the compound used in any given case can readily be determined by simple orientating tests. Usually the substrate is heated to a temperature above about 300° C.

The substrate may be heated in a conventional manner, for instance by resistance heating, by induction heating, or by using electric heating devices such as heating coils or the like. It is also possible to fix a heated wire (filament) in the apparatus. This filament thermally activates the gas phase and may also be used to heat the substrate. This technique is known as "Hot Filament CVD (HFCVD)". The substrate may also be heated by radiant energy. Laser radiation is particularly suitable for this purpose. For instance, lasers may be used which operate in the visible light range, in the ultraviolet range or in the infrared range. Lasers have the advantage that they can be focussed to a greater or lesser extent. In this way, certain limited areas or points on the substrate may be specifically heated.

Since the thermal CVD process is usually carried out at reduced pressure, it will be apparent to persons skilled in the art to provide a pressure-tight apparatus such as are used in high-vacuum techniques. Such apparatus advantageously have gas lines which can be heated for the starting compound and/or any additional gas. Furthermore, they contain openings which can be shut off for letting gas in and out, optionally openings for supplying additional gases, temperature measuring means, if desired an opening for supplying the starting compound, a means for heating the substrate, a pump suitable for producing the desired low pressure, etc. If a CVD process induced by radiant energy is to be carried out, of course a radiation source must also be present.

If the decomposition is to be induced photolytically, then an appropriate apparatus with a suitable radiant energy source, for instance an excimer laser, is used.

Particularly preferably, the deposition of a layer containing B and N is plasma-induced. This plasma-induced decomposition can be performed without thermal support. If desired, however, the substrate may also be additionally heated.

In principle, the plasma may be generated according to widely-varying methods. For instance, the decomposition may be brought about by means of thermal plasmas. These include, for instance, plasma arcs and plasma jets. For thermal plasmas, the pressure in the apparatus used is usually between standard pressure and about 10 Torr.

Plasma processes which are performed at low pressure are particularly suitable. For instance a DC plasma is suitable, which may also be performed in the manner of a pulsed DC plasma. The pressure in the apparatus in this case is between 0.01 and 100 Torr, advantageously between about 0.05 and 1.0 Torr.

Particularly preferably, the decomposition is performed with an AC plasma. In this case, it is possible to distinguish between capacitively or inductively coupled low-frequency plasmas (frequency range: 30 to 300 KHz), medium-frequency plasmas (frequency range: 300 to 3000 KHz) and high-frequency plasmas (frequency range: 3 to 30 MHz). It is also possible to operate in the microwave range (frequency range: 30 MHz to several GHz). An AC plasma having a particularly high frequency is a microwave plasma, which usually operates at 2.45 GHz. The pressure for such AC plasmas is usually between 10 Torr and $10^{-2}$ Torr, but for certain plasmas it may be even lower as explained hereinafter.

Persons skilled in the art will be aware that apparatus for plasma decomposition often include means for generating a magnetic field. This magnetic field usually has the purpose of intensifying the plasma. The degree of ionization is thereby increased.

One particular plasma process supported by a magnetic field is electron cyclotron resonance plasma (ECR plasma). Here the purpose of the magnetic field is to force the electrons generated in the plasma onto orbits about the magnetic field lines. At a magnetic field intensity of 875 Gauss, the angular frequency of the electrons corresponds exactly to the angular frequency of the incoming microwaves (2.45 GHz). This leads to the phenomenon of resonance and thus to an optimum coupling of the microwave power into the plasma. The degree of ionization in an ECR plasma is thus higher than for glow discharge by a factor of 10 to 100.

In such an ECR plasma process, the pressure in the reactor is advantageously between $10^{-1}$ mbar and $10^{-5}$ mbar.

In the process according to the invention, decomposition is preferably effected by a high-frequency plasma, for instance a microwave plasma, or by an ECR plasma. A high-frequency plasma process offers the additional advantage that metal can also be incorporated into the layers at the same time in the manner of a sputtering process. Layers containing metal and boron and nitrogen are then obtained.

Another way of depositing layers containing metal and boron and nitrogen consists in using, in addition to the borazole starting compound of the general formula (I), (II) or (III), a metal compound which can be decomposed under the same conditions. This is possible both with thermal decomposition and for any desired plasma-induced processes, and will be described further below.

The specially preferred embodiments of the present invention, namely decomposition by a high-frequency plasma or by an ECR plasma, will be described further below.

Apparatus which can be used in the decomposition method utilizing a high-frequency plasma are known to persons skilled in the art. They can be evacuated and comprise at least two electrodes by means of which a high-frequency field can be generated. Desirably, the electrodes are arranged vertically and will be referred to hereinafter as "upper electrode" or "lower electrode", respectively. The electrodes may be selectively connected as anode or cathode. The power of the high-frequency field is variable and is for instance 50 to 1500 watts. Applying a DC voltage to the electrodes, referred to below as "bias voltage", DC bias or "bias" for short, permits acceleration of plasma particles onto the substrate which is to be coated. If the cathode is coated with a metal, atoms from this metal will be incorporated by sputtering into the layer which is being deposited on the substrate.

ECR plasma processes are carried out in apparatus which likewise must be vacuum-tight. These apparatus comprise an emitter for emitting a high-frequency or ultrahigh-frequency field, for instance a microwave emitter. Magnetic coils are placed around the plasma chamber, arranged perpendicular to the direction of radiation. These coils produce a magnetic field parallel to the direction of radiation which forces the electrons present in the plasma, under the simultaneous influence of the microwave radiation, into orbits. The power of the microwave emitter is very variable. Depending on the apparatus, the power may be less than 50 watts or up to 800 watts or more. The speed of plasma particles impinging on the substrate can be increased by applying a DC voltage or high frequency AC voltage between the substrate carrier and recipient.

According to one variant of the process according to the invention, a gas atmosphere is used which consists only of vaporized molecules of the starting compound of formula (I), (II) and/or (III) which is used. In this case, layers can be deposited which contain boron, nitrogen, and also carbon and hydrogen. Layers of this type may be used, for example, to protect a substrate against external influences.

According to another, preferred variant of the invention, decomposition is carried out in the presence of additional gases. For example, decomposition may be carried out in the presence of gases which affect the chemical composition or the physical structure of the layer which is to be deposited.

Preferably one or more gases selected from the group of noble gases, in particular argon, hydrogen and nitrogen-containing gases, in particular $N_2$ or $NH_3$, is chosen as an additional gas.

If, for instance, decomposition is carried out in the presence of gases which are regarded as chemically inert, e.g. in the presence of noble gases such as argon or inert gases such as nitrogen, the hardness and adhesive strength of the deposited layers can be modified.

It is also possible to operate in the presence of reactive gases, such as organic amines or, preferably, an atmosphere containing ammonia and/or hydrogen. In such a case layers containing boron and nitrogen are obtained which are very low in carbon and surprisingly are also low in hydrogen.

Furthermore, it is possible to operate in the presence of metal compounds, in particular organic metal compounds. In this case layers are deposited which contain metal, boron, nitrogen, and optionally carbon and hydrogen. Advantageously, metal compounds are used which vaporize and also decompose under the same conditions as the starting compound of formula (I), (II) or (III). In particular, volatile organometallic compounds of refractory metals are used, especially compounds of niobium, tantalum, vanadium, tungsten, molybdenum, titanium, zirconium, hafnium and the iron group metals iron, cobalt and nickel. For instance, corresponding metal halides, metal alkyls, metal alcoholates or metal carbonyls can be used.

Furthermore, it is possible also to use the starting compound of formula (I), (II) and/or (III) as a reactive gas in the plasma diffusion technique. In this technique, known to persons skilled in the art, the workpieces which are to be coated are connected as the cathode and the process is operated in the abnormal glow range. Layers are then obtained on the workpiece which contain metal, boron, nitrogen and possibly carbon.

Furthermore, it is also possible to carry out the decomposition in the presence of halogen-containing gases, in particular in the presence of halogen-containing etching gases. In this case, it is possible in principle to use any desired known gas from the thin-layer technique, in particular nitrogen trifluoride, chlorofluoro(hydro)carbon compounds, perfluorinated alkyl compounds such as, in particular, $CF_4$ or $CFCl_3$. If the plasma decomposition is carried out in the presence of such etching gases, particular phases of the deposited layer, for instance the hexagonal phase or amorphous phases, may be etched away. It is possible in this way to modify the characteristics of the layer in situ.

As noted previously, it is also possible in high-frequency plasma to deposit a layer containing metal, boron, nitrogen, and also possibly carbon and hydrogen by coating the cathode with metal by sputtering. This process is also particularly applicable to refractory metals as explained above. In this variant it is also possible to operate in the presence of further gases. The effect on the deposited layer is as described above.

The thickness of the deposited layer depends on the intended use, and may be very variable. It is possible to obtain layers having thicknesses of up to 40 $\mu$m, for example between $10^{-2}$ and 20 $\mu$m. The layers of the invention are distinguished by great hardness and a corresponding protective effect. In particular, it is possible to produce transparent layers.

Widely varying substrates can be coated by the process of the invention. For instance, metallic substrates, such as steels, refractory metals, aluminium and aluminium alloys, noble metals such as gold, coinage metals, platinum etc. can be coated. Furthermore, it is possible in accordance with the invention to coat ceramic substrates, for instance oxide materials composed of aluminium oxide or zirconium oxide and/or non-oxides such as carbides or nitrides. Similarly, it is also possible in accordance with the invention to coat substrates made of glass, for instance of silicon dioxide or silicate glass. Polymeric substrates such as polymethyl methacrylate, polypropylene, polyethylene, polystyrene, polyphenylene sulphide, polyvinyl chloride, polyamides, polyimides, epoxy resins and others can also be coated, as can semiconductor materials such as silicon or gallium arsenide. Other possible substrates include, for example, fibers, such as carbon fibers.

The boron- and nitrogen-containing layers which are deposited in accordance with the process of the invention are hard layers and serve to protect the substrates on which they are deposited from wear, corrosion and oxidation. Substrates coated in this way may be used for widely varying purposes. Hardened substrates which are protected against wear may for instance be used in mechanical engineering as printing machine components (rollers, etc.), as turbine blades, as barrel extruders, or as injection molds. Cutting tools, pressing tools or mechanical drive components such as gear wheels, bearings or shafts, and also fittings and nozzles, may likewise be hardened and protected against wear using the process of the invention.

In aviation and space travel, for instance brake components, landing gear components or power unit parts may be hardened and protected against wear according to the process of the invention.

It is possible to coat the torus wall of fusion plasma reactors with a hard layer containing B, C, N and H by means of a plasma-supported deposition process according to the invention.

In the motor vehicle industry in particular mechanical drive components such as gear wheels, bearings, shafts (camshafts) etc. and parts in the hot area of the engine such as valves, piston rings or cylinder walls and also connecting rods may be coated and hardened and also protected against wear in accordance with the process of the invention.

In electrical engineering, for instance electrodes can be treated according to the invention.

In fine mechanics and optics, for instance fine-mechanical drive elements such as gear wheels, bearings or shafts can be coated, hardened and protected against wear according to the invention. The transparent layers obtainable according to the invention are particularly advantageous. It is possible to coat optical components with such layers without affecting the sensitivity of the components to certain types of electromagnetic radiation such as light. For instance, photoelectric cells may be provided with a protective layer or an anti-reflection coating or be improved optically, without affecting the optical properties of the photoelectric cells. Another field of use is the deposition of layers according to the invention as protective layers on mirrors, for instance mirrors made of gold, such as are used in laser apparatus.

Layers deposited according to the invention, which in addition also contain metal, are likewise hard material layers, and protect against corrosion and wear. Furthermore, they are valuable due to their reflective properties.

The following examples are intended to further illustrate the process of the invention without, however, restricting its scope. In the examples, "Bp" stands for "boiling point", "Mp" stands for "melting point", "Sp" stands for "sublimation point", "lit." stands for "literature value", "meas." stands for "measured", and "sccm" stands for "standard cubic centimeter".

EXAMPLE 1

Preparation of N,N',N''-trimethylborazole 41.1 g (1.1 mole) of sodium borohydride and 67.5 g (1.0 mole) of methyl ammonium chloride were placed under inert gas in a 1 liter three-necked flask equipped with a magnetic stirrer, gas inlet, dropping funnel and reflux condenser with a trap cooled to −196° C. connected thereto. Approximately 500 ml of triethyleneglycol dimethylether were added in drops through the dropping funnel over the course of 10 minutes. The reaction began with great evolution of heat and hydrogen. After 30 minutes, the reaction mixture was then heated with a heating mantle and boiled at reflux for 6 hours. Extensive foaming was observed. Then the constituents which boiled at up to 80° C. and 2 Torr were initially distilled off. These constituents were fractionated over a Vigreux column. The borazole derivative boiled at 200 to 250 Torr and a boiling temperature of 95° to 115° C.

Yield: 19.9 g (48.7% of theoretical): $n^{D20}$ meas.: 1.4375 $n^{D20}$ lit.: 1.4375

EXAMPLE 2

Preparation of N,N',N''-trialkylborazole with alkyl=n-propyl, i-propyl and t-butyl 104 g (2.75 mole) of sodium borohydride in 1 liter of dry tetrahydrofuran and 3 moles of primary alkylamine were placed under inert gas in a 4 liter three-necked flask with a mechanical stirrer (KPG stirrer), reflux condenser and dropping funnel. 390 g (2.75 mole) of boron trifluoride etherate were added in drops to this mixture over the course of 2 to 3 hours with hard stirring in such a manner that the evolution of gas was not excessively vigorous. The mixture was boiled for 2.5 hours at reflux, and then precipitated sodium tetrafluoroborate was filtered out using a reversible frit. Subsequently, readily volatile constituents, particularly ether, tetrahydrofuran and excess amine, were distilled off.

The propylborazole compounds were subjected to fractional distillation, and the t-butylborazole compound was sublimated.

| 2.1 | Preparation of N,N',N''-tri-n-propylborazole |
|---|---|
| Bp | 100° C./14 Torr |
| $n^{D20}$ lit. | 1.4484 |
| $n^{D20}$ meas. | 1.4475 |
| Yield: | 160 g (86% of theoretical) |
| Comment: | The product partially crystallizes out when allowed to stand. |
| 2.2 | Preparation of N,N',N''-tri-isopropylborazole |
| Bp lit. | 44° C./1 Torr |
| Bp meas. | 75° C./10 Torr |
| nD20 lit. | 1.4434 |
| nD20 meas. | 1.4440 |
| Yield: | 81.65 g (44% of theoretical) |
| Comment: | The product partially crystallizes out during distillation and when allowed to stand. |
| 2.3 | Preparation of N,N',N''-tri-tert-butylborazole |
| Sp. | 60-70° C./$10^{-3}$ Torr |
| Mp lit. | 89-94° C. |
| Mp meas. | 90-92° C. |

71 g of crude product were sublimated: yield (sublimate): 53.2 g (75% of theoretical).

$^1$H-NMR Data (in $CD_2Cl_2$) of borazoles

| (H—B—N—CH$_3$)$_3$ | N—CH$_3$ | 3.04 ppm (S; 3H) |
|---|---|---|
| (H—B—N—CH$_2$—CH$_2$—CH$_3$)$_3$ | N—CH$_2$ | 3.25 ppm (T; 2H) |
| | C—CH$_2$—C | 1.51 ppm (M; 2H) |
| | —CH$_3$ | 0.85 ppm (T; 3H) |
| (H—B—N—CH(CH$_3$)$_2$)$_3$ | C—H | 3.67 ppm (M; 1H) |
| | —CH$_3$ | 1.23 ppm (D; 6H) |
| (H—B—N—C(CH$_3$)$_3$)$_3$ | —CH$_3$ | 1.37 ppm (S; 9H) |

EXAMPLE 3

Deposition of a BN Layer in ECR Plasma 0.8 sccm N-trimethylborazole and 5 sccm ammonia were introduced into an ECR plasma chamber. An ECR plasma was ignited at an operating pressure of 0.060 Pa. Beneath the plasma chamber there was in the receptacle spaced a distance of 5 cm from the lower edge of the chamber, a substrate platform, heated to 600° C., carrying a 2 inch silicon wafer. The coupled microwave power was 600 watts. A DC bias of −75 V was applied to the substrate. Under these conditions, a carbon-free film having the following composition: B=49.6 atom percent, N=46.4 atom percent, was deposited at a growth rate of 1.2 μm/h. The elemental composition was determined by means of EPMA (electron probe micro analysis).

EXAMPLE 4

Deposition of a BCNH Layer in ECR Plasma 3 sccm argon were introduced into an ECR plasma chamber, and an ECR plasma was ignited. 1.0 sccm N-trimethylborazole was introduced into the receptacle and passed into the plasma jet. The operating pressure was 0.036 Pa, and the coupled microwave power was 320 watts. The unheated substrate platform was spaced a distance of 10 cm from the lower edge of the plasma chamber. The heating of the 2 inch silicon wafer by the plasma amounted to about 150° C. A transparent film having the elemental composition B=38.4 atom percent; C=29.9 atom percent, and N=30.7 atom percent (determined by EPMA), was obtained at a deposition rate of 0.7 μm/h. The presence of small amounts of hydrogen in the film could be demonstrated through infrared (IR) spectroscopic analysis, by the presence of N—H, C—H and B—H vibrations.

EXAMPLE 5

Deposition of a BCNH Layer in High-Frequency (HF) Plasma

To deposit a film in a high frequency plasma, a parallel-plate reactor was used in which the upper or lower electrode could function selectively as a high frequency electrode ("cathode"). 18 sccm argon and 1.5 sccm N-trimethylborazole were introduced into this reactor. The substrates (silicon, high-grade steel, glass) were placed on the lower, unheated electrode. When the substrate-bearing electrode was connected as the HF electrode, an HF plasma was ignited at a pressure of 1.2 Pa. The supplied HF power was 200 watts, whereby a DC bias (self-bias) of 650 V arose at the substrate electrode. A film having the following elemental composition: B=37.3 atom percent; C=35.75 atom percent, and N=24.49 atom percent, was obtained at a deposition rate of 0.43 μm/h. The IR spectrum of this film showed weak absorptions in the range of the N—H, C—H and B—H vibrations.

EXAMPLE 6

Deposition of a TiBCN Layer in HF Plasma

A TiBCN layer was deposited in a sputter-CVD installation. Titanium was dusted off from a titanium target by HF sputtering, and at the same time N-trimethylborazole was introduced into the reactor.

Sputtering conditions: 40 sccm argon, pressure 2.0 Pa, HF power: 1.0 kW; DC self-bias 1.9 kV.

N-trimethylborazole was then added to this sputtering plasma until the operating pressure rose to 2.05 Pa. A TiBCN layer was deposited on the unheated substrate electrode by reacting titanium with N-trimethylborazole excited in the plasma. Silicon, high-grade steel and glass served as substrates. At a growth rate of 0.9 82 m/h, a dark-brown reflective layer was deposited. The layer had the following elemental composition (determined by EPMA): Ti=26.9 atom percent; B=23.5 atom percent; C=35.9 atom percent, and N=14.6 atom percent. The X-ray diffractogram of the film confirmed the existence of cubic carbide and nitride phases.

EXAMPLE 7 to 9

Deposition of BN Layers by Decomposing N,N',N''-Trimethyl Borazole by a Thermal CVD Process

EXAMPLE 7

Deposition of BN Layers on a Silicon Wafer 7.1: General procedure

The deposition was carried out according to the "thermally activated hot filament CVD process" (hot-filament process). In such a process, the substrate, e.g. a silicon wafer, is heated by the hot filament which is positioned near the substrate. The temperature of the substrate can be regulated by means of the electric current which heats the filament.

800 sccm hydrogen gas and 5 to 30 sccm N,N',N''-trimethylborazole were metered into the reactor. The pressure in the reactor ranged between 23 and 25 mbar. The substrate was heated to temperatures between 650° C. and 1000° C., the filament temperature was regulated to 980° C. to 2200° C. The precursor, i.e. the used borazole, was warmed to 60° C.

Reaction conditions and rates of deposition of four experiments with varying substrate temperatures and precursor pressure were as follows:

| | | |
|---|---|---|
| 7.2.1. | substrate temperature | 650° C. |
| | precursor pressure | 0.3 mbar |
| | hydrogen pressure | 22.8 mbar |
| | deposition rate of BN layer | 0.02 micrometers/minute |
| 7.2.2. | substrate temperature | 860° C. |
| | precursor pressure | 0.3 mbar |
| | hydrogen pressure | 23.01 mbar |
| | deposition rate of BN layer | 0.3 micrometers/minute |
| 7.2.3. | substrate temperature | 860° C. |
| | precursor pressure | 1.0 mbar |
| | hydrogen pressure | 22.8 mbar |
| | deposition rate of BN layer | 1.3 micrometers/minute |
| 7.2.4. | substrate temperature | 1000° C. |
| | precursor pressure | 0.2 mbar |
| | hydrogen pressure | 23.14 mbar |
| | deposition rate of BN layer | 0.08 micrometers/minute |

Analysis of the layers by infrared (IR)-spectroscopy revealed that layers of hexagonal BN had been deposited. The examples demonstrate that deposition rate and thickness of the BN layers can advantageously be regulated.

EXAMPLE 8

Thermal CVD Deposition of BN Layers on Substrates other than Silicon 8.1.-8.4. Deposition on molybdenum wafers
8.5.-8.8. Deposition on tungsten wafers
8.9.-8.12. Deposition on glass fibers Examples 7.2.1. to 7.2.4 were repeated. Instead of a Silicon wafer, molybdenum wafers (ex. 8.1.-8.4.), tungsten wafers (ex. 8.5.-8.8.) and glass fibers (ex. 8.9.-8.12.) were used. The layers obtained were comparable to those of the corresponding examples 7.2.1. to 7.2.4.

Comparable layers were also obtained by substituting $N_2$, Ar or $NH_3$ for hydrogen.

The foregoing description and examples have been set forth merely to illustrate the invention and are not intended to be limiting. Since modifications of the described embodiments incorporating the spirit and substance of the invention may occur to persons skilled in the art, the invention should be construed broadly to include all variations falling within the scope of the appended claims and equivalents thereof.

What is claimed is:

1. A process for depositing a layer containing boron (B) and nitrogen (N) on a substrate, comprising depositing a layer containing B and N by decomposing in the presence of said substrate a compound corresponding to the formula (I), (II) or (III)

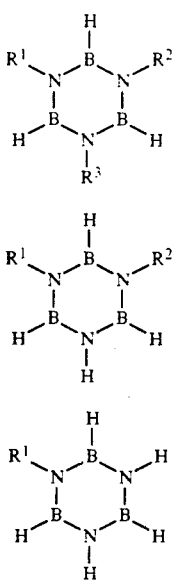

wherein $R^1$, $R^2$ and $R^3$ may be identical or different and represent:
- linear or branched alkyl with 1 to 12 carbon atoms;
- linear or branched alkyl, substituted by one or more substituents selected from the group consisting of halogen, lower alkoxy, di-lower alkylamine, and the adduct thereof with $BH_3$;
- linear or branched alkyl, substituted by one or more aryl radicals, in particular phenyl;
- linear or branched alkyl, substituted by one or more aryl radicals, which themselves are substituted by one or more substituents selected from the group consisting of halogen, lower alkyl, and halogenated lower alkyl;
- cycloalkyl, cycloalkenyl or cycloalkadienyl with a C4 to C7 carbon ring;
- cycloalkyl, cycloalkenyl or cycloalkadienyl with a C4 to C7 carbon ring, substituted by lower alkyl;
- aryl, in particular phenyl, toluyl, aryl with one or more condensed rings, in particular naphthyl;
- aryl, in particular phenyl, substituted by one or more substituents selected from the group consisting of halogen, lower alkyl; lower alkyl substituted by halogen; lower alkoxy; di-lower alkylamine; phenyl; cycloalkyl with C4 to C7 carbon ring;
- alkenyl with 2 to 4 carbon atoms;
- tri-lower alkyl silyl; or
- halogen.

2. A process according to claim 1, wherein a compound corresponding to the formula (I) is decomposed.

3. A process according to claim 2, wherein a compound corresponding to the formula (I) is decomposed in which $R^1$, $R^2$ and $R^3$ may be identical or different and represent linear or branched alkyl with 1 to 12 carbon atoms.

4. A process according to claim 3, wherein a compound corresponding to the formula (I) is decomposed in which $R^1$, $R^2$ and $R^3$ may be identical or different and represent linear or branched alkyl with 1 to 5 carbon atoms.

5. A process according to claim 4, wherein $R^1$, $R^2$ and $R^3$ are each individually selected from the group consisting of methyl, ethyl, n-propyl, isopropyl, n-butyl, isobutyl and t-butyl.

6. A process according to claim 1, wherein a compound corresponding to the formula (I) is decomposed in which $R^1$, $R^2$ and $R^3$ are identical.

7. A process according to claim 1, wherein said compound can be converted into the gas phase at a temperature of at most 150° C. and a pressure of at most standard pressure.

8. A process according to claim wherein said compound is decomposed by application of thermal energy.

9. A process according to claim wherein said compound is decomposed by application of radiant energy.

10. A process according to claim 9, wherein said compound is decomposed by application of laser radiation.

11. A process according to claim wherein said compound is decomposed by plasma-induced decomposition.

12. A process according to claim wherein decomposition of said compound is induced by a high-frequency plasma, a microwave plasma, or an electron cyclotron resonance plasma.

13. A process according to claim 1, wherein said compound of formula (I), (II) or (III) is a vaporizable compound and is converted into the gas or vapor phase at reduced pressure and then decomposed under reduced pressure.

14. A process according claim 1, wherein said compound is decomposed in the presence of at least one additional gas.

15. A process according claim 14, wherein said additional gas is selected from the group consisting of noble gases, hydrogen, nitrogen-containing gases.

16. A process according to claim 14, wherein said compound is decomposed in the presence of at least one additional gas selected from the group consisting of argon, $N_2$, and ammonia.

17. A process according to claim wherein in addition to said compound of formula (I), (II) or (III), a metal compound, which is decomposable under the same conditions as said compound of formula (I), (II) or (III), is also decomposed to obtain a layer which comprises boron, nitrogen and said metal.

18. A process according to claim 17, wherein a layer is obtained which further comprises carbon.

19. A process according to claim wherein said compound of formula (I), (II) or (III) is decomposed by plasma-induced decomposition, and a metal is simultaneously deposited on said substrate by sputtering to obtain a layer containing boron, nitrogen and said metal.

20. A process according claim 19, wherein said metal is a refractory metal.

21. A process according to claim 1, wherein said substrate is selected from the group consisting of metal, ceramics, glass, polymers and semiconductors.

* * * * *